(12) United States Patent
Hsien

(10) Patent No.: US 6,624,014 B2
(45) Date of Patent: Sep. 23, 2003

(54) PROCESS FOR FABRICATING A DEEP SUBMICRON COMPLEMENTARY METAL OXIDE SEMICONDUCTOR DEVICE HAVING ULTRA SHALLOW JUNCTIONS

(75) Inventor: Li-Jen Hsien, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 145 days.

(21) Appl. No.: 09/794,374

(22) Filed: Feb. 27, 2001

(65) Prior Publication Data

US 2002/0115247 A1 Aug. 22, 2002

(30) Foreign Application Priority Data

Feb. 16, 2001 (TW) ....................................... 90103508 A

(51) Int. Cl.$^7$ ......................................... H01L 21/8238
(52) U.S. Cl. ........................ 438/199; 438/229; 438/231
(58) Field of Search ................................. 438/199, 217, 438/229, 233, 299, 301, 303, 306, 154, 230, 231, 232, 558, 221; 257/740

(56) References Cited

U.S. PATENT DOCUMENTS 6,303,453 B1 * 10/2001 Schmitz et al. ............. 438/301

OTHER PUBLICATIONS

Wolf & Tauber, Silicon Process for the VLSI Era vol. 1: Process Technology, 1986, Lattice Press, p. 171.*

* cited by examiner

Primary Examiner—Evan Pert
(74) Attorney, Agent, or Firm—J.C. Patents

(57) ABSTRACT

A process for fabricating a deep submicron complementary metal oxide semiconductor device having ultra shallow junctions. After a gate is formed on the substrate on which an N well region and a P well region are separated from each other by shallow trench isolation, a silicon nitride is formed as a diffusion source layer. Subsequently, a P type ion implantation is performed in the N well region by using boron ions to form a P type diffusion source layer in the N well region. An N type ion implantation is performed in the diffusion source layer of the P well region by using arsenic ions to form a N type diffusion source layer on the P well region. Spacers are formed at the sidewalls of the gate by deposition and etching back. Heavy ion implantation is performed in the N well region and the P well region, respectively. Finally, a rapid thermal process is carried out to form a source/drain region and ultra shallow junctions in the complementary metal oxide semiconductor device.

19 Claims, 4 Drawing Sheets

PROCESS FOR FABRICATING A DEEP SUBMICRON COMPLEMENTARY METAL OXIDE SEMICONDUCTOR DEVICE HAVING ULTRA SHALLOW JUNCTIONS

BACKGROUND OF THE INVENTION

1. Field of the Invention

The present invention relates to a process for semiconductor devices. More specifically, it relates to a process for fabricating a deep submicron complementary metal oxide semiconductor device having ultra shallow junctions.

2. Description of the Related Art

The design of a lightly doped drain is widely used to reduce the short channel effects generated in NMOS and CMOS devices. It is achieved by further providing a source/drain region near the channel having less dopants than the original MOS source/drain region.

By increasing the integration of the integrated circuit, the area of the semiconductor device is decreased and the design dimension is thus reduced. Due to the advances in the semiconductor technology, the integration of integrated circuit devices have been developed to deep submicron. In deep submicron complementary metal oxide semiconductor devices, the doping is carried out with an implanting energy of only thousand eV, called a shallow junction process. An ultra shallow junction is formed for the lightly doped drain to prevent the short channel effect.

However, in a conventional shallow junction process the diffusion of the boron ions is larger than that of the arsenic ions. Therefore, by using the conventional implantation process it is difficult to form P+/N type and N+/P type ultra shallow junctions, since the semiconductor processes have been reduced to a level lower than 0.18 micron.

In order to overcome the prior problems, a Ge morphize preimplantation is usually adopted. FIGS. 1A to 1F are cross sectional views showing a conventional process for fabricating shallow junctions of a complementary metal oxide semiconductor device. First, with reference to FIG. 1A, an N well region 102 and a P well region 104 are formed on the substrate 100, separated from each other by a shallow trench isolation 106. Then, a polysilicon gate 108 is formed on the N well region 102 and the P well region 104, respectively. A Ge premorphize implantation 110 is carried out on the surface of the above structure to form amorphous silicon regions 112 and 114 on the N well region 102 and P well region 104, respectively. The energy for implantation is in the range of about 2000 to 5000 eV.

Referring to FIG. 1B, a photoresist layer 116 is formed on the P well region 104. A P type ion implantation 118 using boron ions is performed in the N well region 102 so that the amorphous silicon region 112 on the surface of the N well region 102 adsorbs the P type ions. The energy for implantation is lower than 1000 eV.

Referring to FIG. 1C, (it doesn't show that the photoresist layer is removed) after the photoresist layer 116 is removed, another photoresist layer 122 is formed on the N well region 102. An N type ion implantation 124 using arsenic ions is carried out on the surface of the P well region 104 so that the amorphous silicon region 114 on the surface of the P well region 104 adsorbs the N type ions. The energy for implantation is no more than about 2000 eV.

Referring to FIG. 1D, (it doesn't state that the photoresist layer is removed) after the photoresist layer 122 is removed, spacers 128 are formed on the sidewalls of the polysilicon gate 108 by deposition and etching back.

Referring to FIG. 1E, P type and N type ions are heavily implanted into the N well region 102 and the P well region 104, respectively. Finally, a rapid thermal process is performed to form source/drain regions 130, 132 and shallow junctions 120, 126 on the complementary metal oxide semiconductor device.

In the above process for fabricating a complementary metal oxide semiconductor, in order to eliminate the channel effect resulted from ion implantation, a Ge premorphize implantation is carried out, before implanting dopants, to form a amorphous silicon layer on the crystalline substrate, thereby controlling the depth of the junction. However, such approach has some problems such as the existence of some voids at the interface of the amorphous silicon layer and the surface of the substrate/crystalline substrate. Furthermore, such Ge premorphize implantation process may result in damage on the surface of the silicon substrate.

In a conventional process, in order to decrease the depth of the junction, the energy for ion implantation has to be reduced. However, the ejecting range of the dopant is reduced as the energy for ion implantation is decreased. For low energy (no more than thousands eV) boron ion implantation, the depth of the junction would not be significantly decreased by lowering the energy of the ion implantation. Moreover, the boron dopants bond the voids in the silicon substrate to form a boron-void combination which results in transient enhanced diffusion (TED). In the course of annealing, such boron-void combination diffuses very rapidly and has a deeper junction than that obtained by boron alone. An oxygen enhanced diffusion (OED) effect allows the oxygen atoms to diffuse into the silicon substrate when annealing. Even if the boron ions are implanted with the energy lower than thousands eV, the transient enhanced diffusion and the oxygen enhanced diffusion still exist. Further, it is difficult to apply the existing ion implantation equipment used in the boron ion implantation with a voltage of no more than thousands eV. Therefore, it is required that the ion implantation device is replaced although no device useful in mass production is available.

SUMMARY OF THE INVENTION

To overcome the disadvantages set forth above, it is one object of the present invention to provide a process far fabricating a complementary metal oxide semiconductor device having ultra shallow metal junctions. A low-stressed silicon nitride layer is formed to adsorb ions as a diffusion source layer when light ion implantation is performed. The silicon nitride layer is also used to prevent damage on the surface of the silicon substrate during the Ge preamorphizing implantation and furthermore to prevent the channel effect resulting from ion implantation. Therefore, the process of the present invention is suitable for deep submicron technology to produce a device having a smaller size and a higher reliability.

Another object of the present invention is to form ultra shallow junctions having an ultra small depth and a low resistance in order to reduce the short channel effect, and thereby reducing the transient enhanced diffusion and oxygen enhanced effect.

Furthermore another object of the present invention is to provide a process for forming ultra shallow junctions which can perform ion implantation by using the existing device and which can be applied in a process lower than 0.1 µm.

According to one aspect of the present invention, a process for fabricating a complementary metal oxide semiconductor device is provided. After a gate is formed on the substrate on which a N well region and a P well region are separated from each other by a shallow trench isolation, a diffusion source layer having a thickness of about 200 to 400 angstrom is formed. Subsequently, a photoresist layer is formed on the P well region. A light ion implantation is performed in the N well region by using P type ions with a concentration ranged from $10^{14}$ to $10^{15}/cm^2$ with an energy level of 1 to 15 Kev. A P type diffusion source layer is formed on the N well region. After the photoresist layer covering the P well region is removed, another photoresist layer is covered on the N well region. A light ion implantation is performed on the P well region by using N type ions with a concentration ranged from $10^{14}$ to $10^{15}/cm^2$ by using an energy level of 1 to 10 Kev to form a N type diffusion source layer in the P well region. After the photoresist layer on the N well region is removed, spacers are formed on the sidewalls of the gate by deposition and etching back. Then, a heavy implantation of P type and N type are performed in the N well region and the P wellregion, respectively to form the source/drains. Finally, a rapid thermal process is carried out for 10 to 20 seconds in the temperature of 950 to 1050° C. to diffuse the boron or arsenic ions located in the diffusion source layer into the surface of the substrate to form a source/drain region and ultra shallow junctions.

As mentioned above, it is one of the objects of the present invention to form a silicon nitride layer by plasma enhanced chemical vapor deposition. When light implantation of boron ions and arsenic ions is performed, the silicon nitride layer is used as a diffusion source layer to absorb the ions implanted and to prevent the channel effect. The light ion implantation can be performed with a higher energy level by using the existing ion implantation device. During the annealing process, the silicon nitride layer can prevent and reduce the transient enhanced diffusion and the oxygen enhanced effect. Therefore, the boron ions and the arsenic ions diffuse from the diffusion source layer to the silicon substrate to form an ultra shallow junction which reduces the short channel effect of the devices. Damage to the surface of the silicon substrate caused by the Ge preamorphize implantation can be avoided in the process of the present invention.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1A:
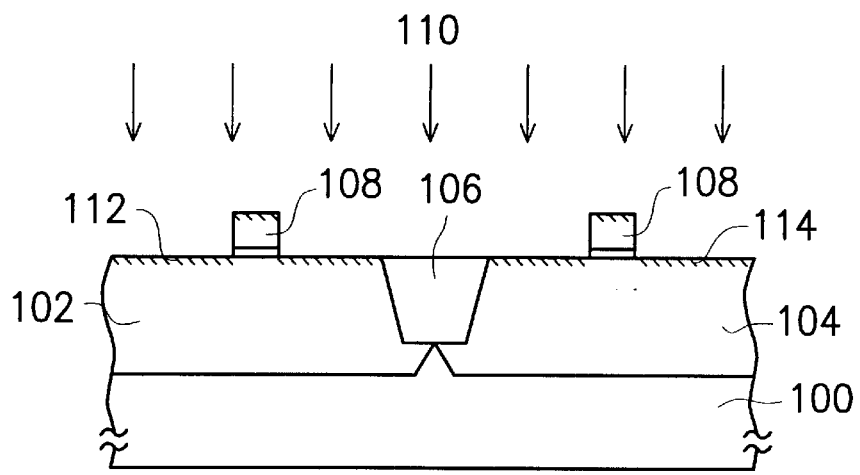
FIGS. 1A to 1E are cross sectional views showing a conventional process of fabricating a complementary metal oxide semiconductor device.
Figure 1B:
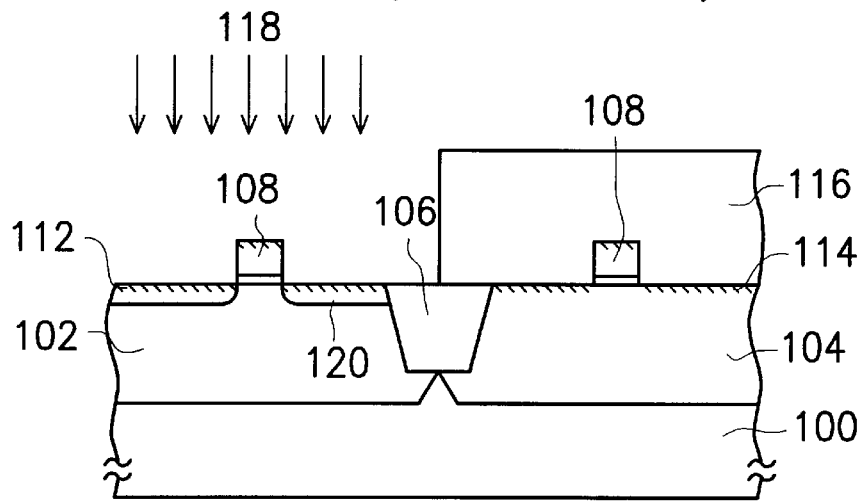
Figure 1C:
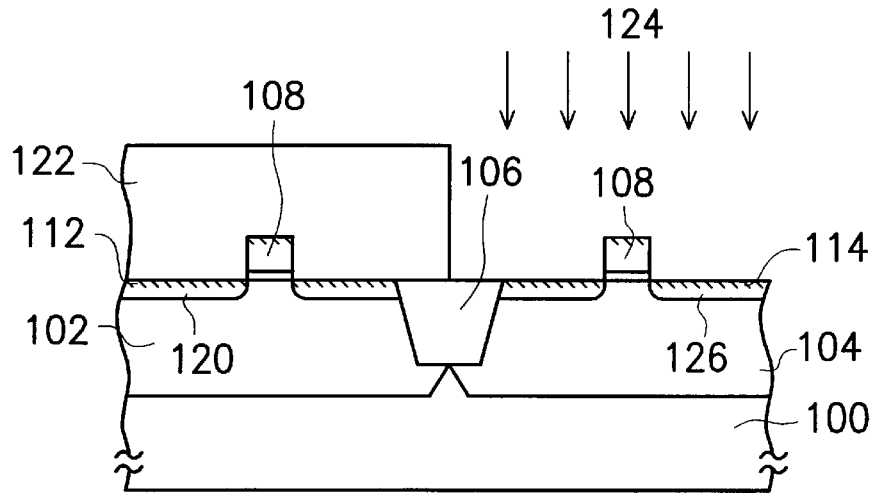
Figure 1D:
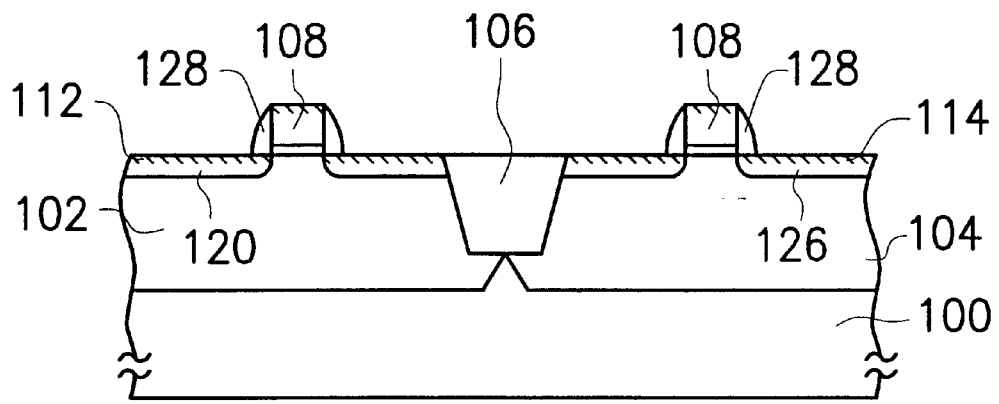
Figure 1E:
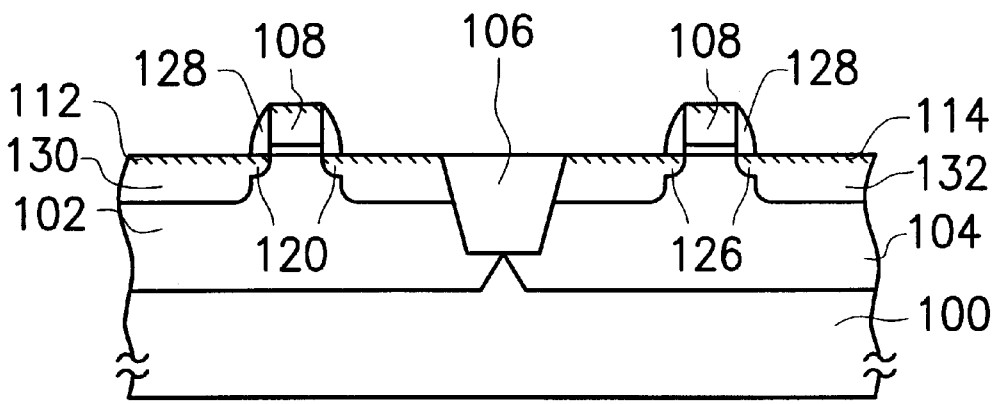
Figure 2A:
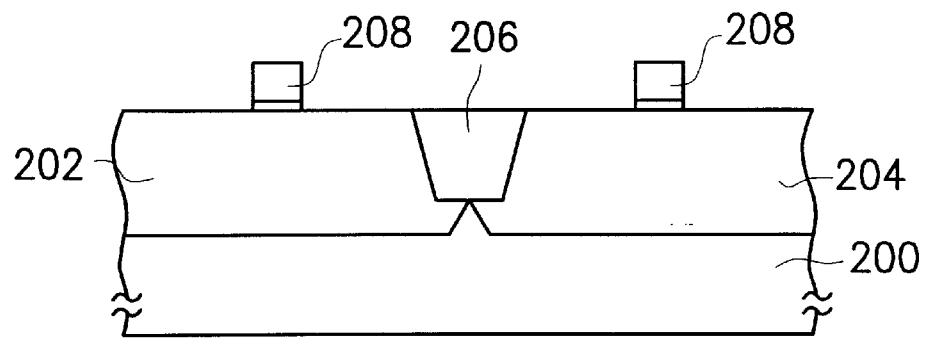
FIGS. 2A to 2F are cross sectional views showing a process of fabricating a complementary metal oxide semiconductor device according to a preferred example of the present invention.
Figure 2B:
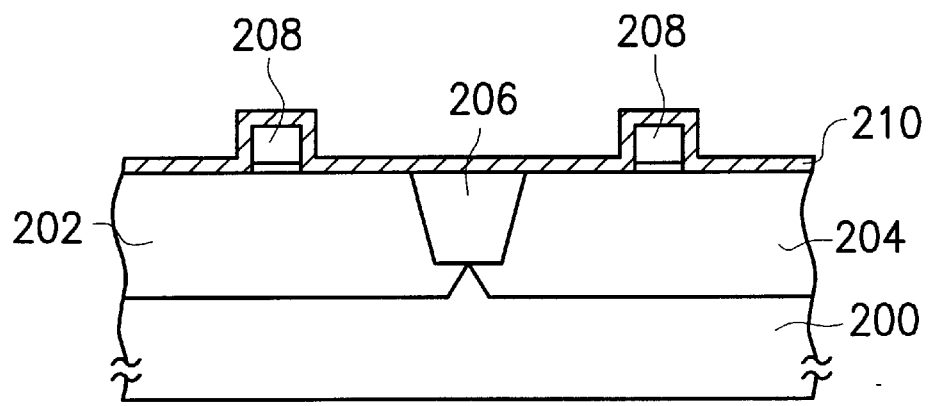

Referring to FIG. 2A, a polysilicon gate 208 is formed on a substrate 200 where a N well region 202 and a P well region 204 are separated by a shallow trench isolation 206. Referring to FIG. 2B, a diffusion source layer 210 is formed on the surface of the structure as set forth above. The diffusion layer 210 is made of silicon nitride, for example, by a method such as plasma enhanced chemical vapor deposition with a thickness of about 200 to 400 angstrom. The diffusion source layer 210 helps to trap P type ions on the surface of the substrate 200. The diffusion source layer 210 does not cause damage to the surface of the silicon substrate 200 like the Ge preamorphize implantation process does.

Figure 2C:
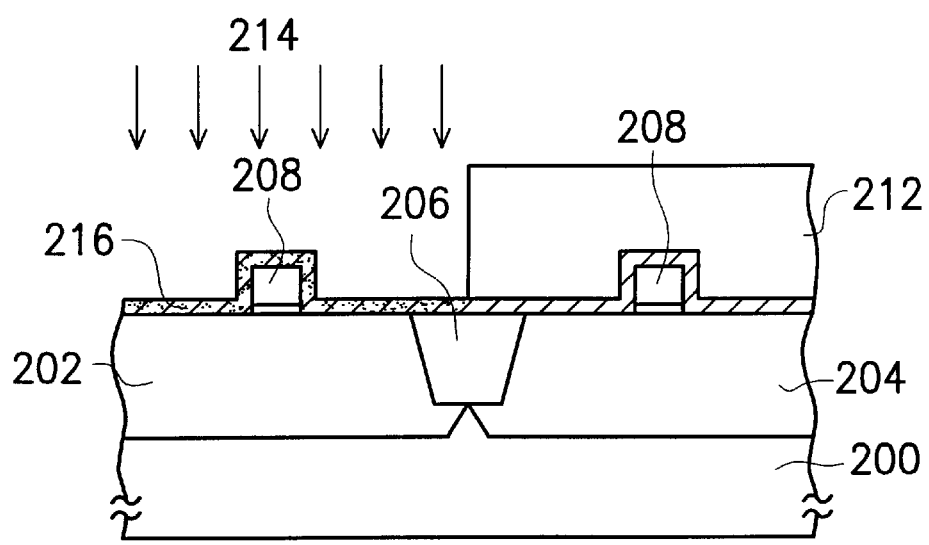

Referring to FIG. 2C, a photoresist layer 212 is formed on the P well region 204. A P type ion implantation 214 is carried out using P type ions such as boron ions in the N well region 202. The P type ions implanted are trapped by the diffusion source layer 210 on the surface of the N well region 202 and are not implanted directly in the substrate 200. Thus, a diffusion source layer 216 having P type ions is formed on the surface of the N type well region 202. With the diffusion source layer 216 as a barrier, the implantation energy level can be raised up to the range of 1 to 15 Kev, which can be performed by using the existing ion implantation device. The concentration of the ions implanted ranges from about $10^{14}$ to $10^{15}/cm^2$.

Figure 2D:
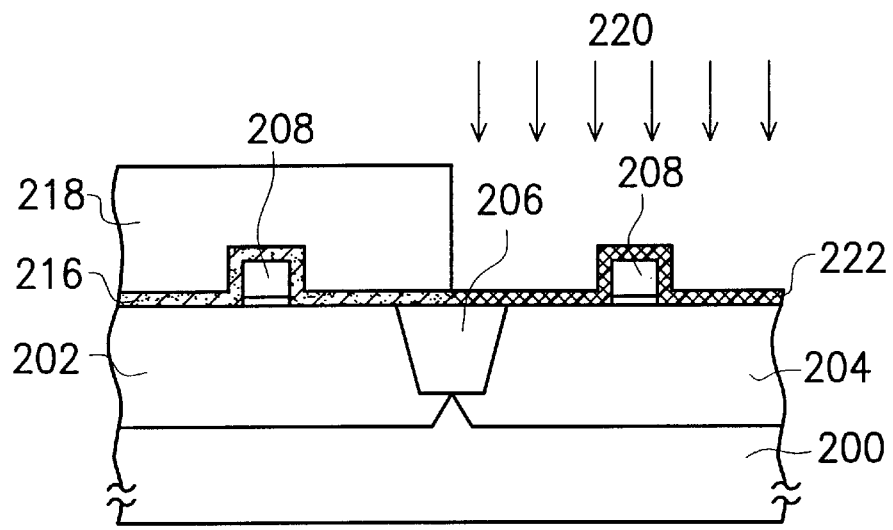

Referring to FIG. 2D, after the photoresist layer 212 is removed, another photoresist layer 218 is formed on the N well region 202. An N type ion implantation 220 is performed in the P well region 204 by using N type ions such as arsenic ions. The N type ions implanted are trapped in the diffusion source layer 210 on the surface of the P well region 204. Moreover, a diffusion source layer 222 having N type ions is formed on the surface of the P type well region 204. Because of the barrier of the diffusion source layer 222, the implantation energy level can be enhanced to the range of 1 to 10 Kev, which can be provided by the existing ion implantation device. The concentration of the ions implanted ranges from about $10^{14}$ to $10^{15}/cm^2$.

Figure 2E:
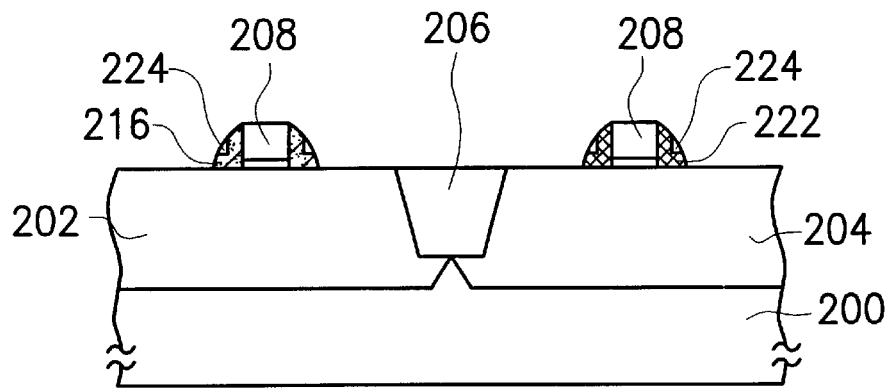

Referring to FIG. 2E, after the photoresist 218 is removed, an insulating layer is formed on the substrate. The insulating layer is removed by etching back and spacers are formed on the sidewalls of the gate. Using the silicon substrate 200 as etching stop, the diffusion source layers 216, 222 not covered by the spacers 224 are removed to leave the P type diffusion source layer 216 and the N type diffusion source layer 222 under the spacers 224.

Figure 2F:
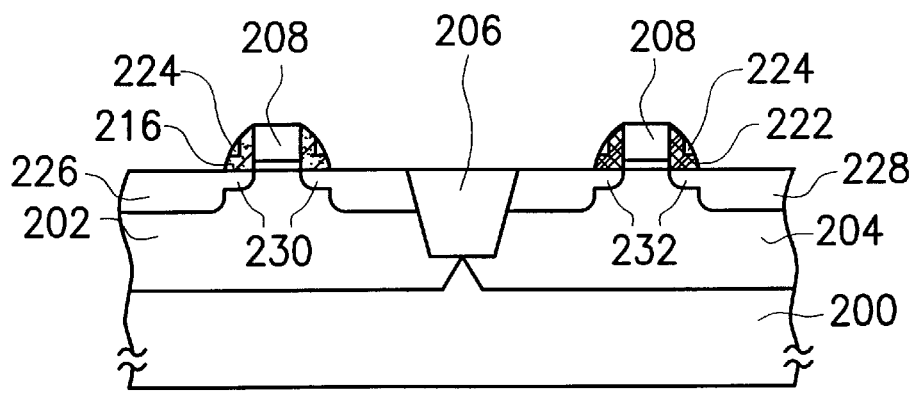

Finally, referring to FIG. 2F, a P type ion implantation and an N type ion implantation are performed in the N well region 202 and the P well region 204, respectively. A rapid thermal process is then performed. The P type diffusion source layer 216 and the N type diffusion source layer 222 under the spacers 224 slow the transient enhanced diffusion and the oxygen enhanced diffusion. The P type ions and the N type ions are diffused in the substrate 200 from the P type diffusion source layer 216 and the N type diffusion source layer 222, respectively. At this time, an N type source/drain region 226, a P type source/drain region 228, a N type ultra shallow junction 230 and a P type ultra shallow junction 232 are formed.

Accordingly, it is one of the objects of the present invention to form a low-stressed silicon nitride layer obtained by plasma enhanced chemical vapor deposition on the substrate having a N well region, a P well region, a shallow trench isolation and a polysilicon gate. During light ion implantation of P type ions and N type ions, the channel effect can be reduced by using the ions adsorbed in the silicon nitride as a diffusion source layer. An advantage of the present invention is that light ion implantation can be performed at a higher energy level by the existing implantation device without requiring the device to be changed. During annealing, since the silicon nitride layer provides slow-down transient enhanced diffusion and oxygen enhanced diffusion, the P type ions and the N type ions diffuse from the diffusion source layer to the silicon substrate so as to form an ultra shallow junction which reduces the short channel effect in the device. Damage to the surface of the silicon substrate caused by the Ge preamorphize implantation can be avoided in the process of the present invention. The process set forth above is one suitable for manufacturing the deep submicron complementary metal oxide semiconductor device.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A process for fabricating a deep submicron complementary metal oxide semiconductor device having ultra shallow junctions, comprising:

providing a substrate comprising a P well region, a N well region and a shallow trench isolation;

forming at least a gate on each of the P well region and the N well region;

forming a diffusion source layer on the substrate by performing a plasma enhanced chemical vapor deposition (PECVD);

implanting P type ions in the diffusion source layer on the N well region to form a P type diffusion source layer;

implanting N type ions in the diffusion source layer on the P well region to form a N type diffusion source layer;

forming a spacer at each sidewall of the gate;

implanting P type ions in the N well region and N type ions in the P well region in the substrate; and performing a thermal process to diffuse ions from the diffusion source layer to the substrate to form a N type source/drain region and a N type ultra shallow junction in the N well region and a P type source/drain region and a P type ultra shallow junction in the P well region.

2. The process according to claim 1, wherein the material for the diffusion source layer is silicon nitride.

3. The process according to claim 1, wherein the step of forming the diffusion source layer includes forming the diffusion layer with a thickness of about 200 angstrom to about 400 angstrom.

4. The process according to claim 1, wherein the P-type ions are boron ions.

5. The process according to claim 4, wherein an energy level for implanting the P type ions is about 1 to 15 Kev.

6. The process according to claim 5, wherein a concentration for the ions implantation ranges from about $10^{14}$ to about $10^{15}/cm^2$.

7. The process according to claim 1, wherein the N type ions are arsenic ions.

8. The process according to claim 7, wherein an energy level for implanting N type ions ranges from 1 to 10 Kev.

9. The process according to claim 7, wherein a concentration for the N type ions implantation ranges from about $10^{14}$ to $10^{15}/cm^2$.

10. The process according to claim 1, wherein the steps of forming the source/drain regions is carried out by ion implantation.

11. The process according to claim 1, wherein the thermal process is a rapid thermal process.

12. The process according to claim 11, wherein a temperature for the rapid thermal process is in the range from 950 to 1050° C.

13. A process for fabricating a deep submicron complementary metal oxide semiconductor device having ultra shallow junctions, comprising:

providing a substrate having a P well region, a N well region and a shallow trench isolation;

forming at least a gate on each of the P well region and the N well region;

forming a silicon nitride layer on the substrate by performing a plasma enhanced chemical vapor deposition (PECVD);

implanting boron ions in the silicon nitride layer on the N well region to form a P type diffusion source layer;

implanting arsenic ions in the silicon nitride layer on the P well region to form a N type diffusion source layer;

forming a spacer at each sidewall of the gate;

implanting P type ions in the N well region and N type ions in the P well region in the substrate; and performing a rapid thermal process to diffuse ions from the silicon nitride layer to the substrate to form a N type source/drain region and a N type ultra shallow junction in the N well region and a P type source/drain region and a P type ultra shallow junction in the P well region.

14. The process according to claim 13, wherein the silicon nitride layer has a thickness ranged from about 200 to 400 angstrom.

15. The process according to claim 13, wherein an energy level for implanting the boron or $BF_2$ ions is about 1 to 15 Kev.

16. The process according to claim 15, wherein a concentration for the boron or $BF_2$ ions implantation ranges from about $10^{14}$ to $10^{15}/cm^2$.

17. The process according to claim 13, wherein an energy level for implanting arsenic ions is in the range of 1 to 10 Kev.

18. The process according to claim 17, wherein a concentration for the arsenic ions implantation ranges from about $10^{14}$ to $10^{15}/cm^2$.

19. The process according to 13, wherein a temperature used in the rapid thermal process is in the range of 950 to 1050° C.

* * * * *